(12) United States Patent
Patil et al.

(10) Patent No.: US 10,354,928 B2
(45) Date of Patent: Jul. 16, 2019

(54) INTEGRATION SCHEME FOR GATE HEIGHT CONTROL AND VOID FREE RMG FILL

(71) Applicant: GLOBALFOUNDRIES Inc., Grand Cayman (KY)

(72) Inventors: Suraj Kumar Patil, Ballston Lake, NY (US); Katsunori Onishi, Somers, NY (US); Pei Liu, Clifton Park, NY (US); Chih-Chiang Chang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/038,977

(22) Filed: Jul. 18, 2018

(65) Prior Publication Data

US 2018/0323113 A1     Nov. 8, 2018

Related U.S. Application Data

(62) Division of application No. 15/494,119, filed on Apr. 21, 2017, now Pat. No. 10,056,303.

(51) Int. Cl.
*H01L 21/82* (2006.01)
*H01L 21/8238* (2006.01)
(Continued)

(52) U.S. Cl.
CPC ........... *H01L 21/823842* (2013.01); *H01L 21/28088* (2013.01); *H01L 21/823821* (2013.01); *H01L 27/0924* (2013.01); *H01L 29/4966* (2013.01)

(58) Field of Classification Search
CPC ......... H01L 21/823842; H01L 29/4966; H01L 27/0924; H01L 21/823821; H01L 21/28088
See application file for complete search history.

(56) References Cited

U.S. PATENT DOCUMENTS 6,049,114 A * 4/2000 Maiti ............. H01L 21/823842
257/412
8,877,580 B1 11/2014 Chen et al.
(Continued)

FOREIGN PATENT DOCUMENTS

CN     106409830 A     2/2017
TW     201347092 A     11/2013

OTHER PUBLICATIONS

Office Action for the related Taiwanese Patent Application No. 106139493, dated Jan. 3, 2019, 9 pages.

*Primary Examiner* — Charles D Garber
*Assistant Examiner* — S M Sohel Imtiaz
(74) *Attorney, Agent, or Firm* — Ditthavong & Steiner P.C.

(57) ABSTRACT

A method of controlling NFET and PFET gate heights across different gate widths with chamfering and the resulting device are provided. Embodiments include forming an ILD over a fin; forming cavities in the ILD, each with similar or different widths; forming a high-K dielectric layer over the ILD and in each cavity; forming a pWF metal layer over the dielectric layer in one cavity; recessing the pWF metal layer to a height above the fin; forming an nWF metal layer in the cavities over the dielectric and pWF metal layers; recessing the nWF metal layer to a height above the pWF metal layer; forming a barrier layer over the dielectric and nWF metal layers; filling the cavities with a low-resistive metal; and recessing the barrier and dielectric layers to a height above the nWF metal layer; and concurrently etching the low-resistive metal.

11 Claims, 12 Drawing Sheets

(51) Int. Cl.
  *H01L 21/28*  (2006.01)
  *H01L 27/092*  (2006.01)
  *H01L 29/49*  (2006.01)

(56) References Cited

U.S. PATENT DOCUMENTS

| | | | |
|---|---|---|---|
| 9,018,711 | B1 | 4/2015 | Cai et al. |
| 9,129,986 | B2 | 9/2015 | Zang et al. |
| 9,190,488 | B1 | 11/2015 | Park et al. |
| 9,202,691 | B2* | 12/2015 | Huang ............... H01L 29/4966 |
| 9,455,227 | B1* | 9/2016 | Hung ............... H01L 29/66545 |
| 9,543,419 | B1 | 1/2017 | Fan et al. |
| 9,613,959 | B2* | 4/2017 | Wang ............... H01L 27/0924 |
| 9,640,509 | B1 | 5/2017 | Yang |
| 9,865,703 | B2 | 1/2018 | Ando et al. |
| 2004/0164362 | A1 | 8/2004 | Conley, Jr. et al. |
| 2007/0262451 | A1* | 11/2007 | Rachmady ........ H01L 21/28088 257/758 |
| 2011/0108912 | A1 | 5/2011 | Lu et al. |
| 2012/0012356 | A1* | 1/2012 | Satoh ....................... H03H 3/02 174/50.52 |
| 2012/0139061 | A1* | 6/2012 | Ramachandran ........................... H01L 21/76895 257/410 |
| 2014/0217482 | A1* | 8/2014 | Xie .................... H01L 21/28114 257/288 |
| 2015/0091100 | A1* | 4/2015 | Xie .................... H01L 21/76224 257/401 |
| 2015/0108577 | A1* | 4/2015 | Cai .................... H01L 21/28008 257/369 |
| 2015/0262887 | A1 | 9/2015 | Xu et al. |
| 2016/0042954 | A1* | 2/2016 | Sung ................. H01L 21/32139 257/407 |
| 2016/0093535 | A1* | 3/2016 | Xu ..................... H01L 21/02244 257/392 |
| 2016/0104704 | A1* | 4/2016 | Fang .................. H01L 29/4966 257/392 |
| 2016/0204109 | A1 | 7/2016 | Kim et al. |
| 2016/0336235 | A1* | 11/2016 | Cheng ................. H01L 27/0924 |
| 2016/0343706 | A1* | 11/2016 | Chang ................. H01L 27/0886 |
| 2017/0062282 | A1 | 3/2017 | Lin et al. |
| 2017/0117190 | A1* | 4/2017 | Chung ............ H01L 21/823842 |
| 2017/0194459 | A1* | 7/2017 | Ando ................. H01L 29/66545 |

* cited by examiner

INTEGRATION SCHEME FOR GATE HEIGHT CONTROL AND VOID FREE RMG FILL

RELATED APPLICATION

The present application is a Divisional application of U.S. application Ser. No. 15/494,119, filed Apr. 21, 2017, which is incorporated herein by reference in its entirety.

TECHNICAL FIELD

The present disclosure relates to the manufacture of semiconductor devices, such as integrated circuits (ICs). The present disclosure is particularly applicable to replacement metal gates (RMGs), particularly for the fin field-effect transistor (FinFET)-based 10 nanometer (nm) and 7 nm technology nodes and beyond.

BACKGROUND

As critical dimensions (CD) of ICs shrink, the metal fill in a RMG process becomes difficult. The RMG process requires forming a gate opening in a dielectric layer and filling the gate opening with gate materials. As gate dimensions shrink, the gate opening may be inadequate to fill such that the metal pinches off, thereby resulting in high gate resistance.

Advanced nodes are now employing one or more recesses of either gate work function material (WFM), gate metal fill, or gate spacer and dielectric gap fill over the gates to enable placing the source/drain (S/D) contacts in close proximity for technology scaling. However, the above schemes add new process challenges to control final gate heights across different gate widths (viz. short vs. long) and multi-threshold voltage (Vt) architectures. Some common issues include high-K damage and WFM loss over the gate fin and final gate height inconsistencies, leading to varying self-aligned contact (SAC) cap budgets, which can cause S/D to gate electrode shorts resulting in device performance degradation.

A need therefore exists for methodology enabling improved metal fill and gate height control across short and long channel lengths or gate widths, and the resulting device.

An aspect of the present disclosure is a method of controlling NFET and PFET gate heights including chamfering p-type work function (pWF) and n-type work function (nWF) metals.

Another aspect of the present disclosure is a device including NFET and PFET regions with chamfered pWF and nWF metals.

Another aspect of the present disclosure is a method of controlling short channel and long channel gate heights including chamfering pWF and nWF metals.

Another aspect of the present disclosure is a device including short channel and long channel regions with chamfered pWF and nWF metals.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming an interlayer dielectric (ILD) over a silicon (Si) fin; forming first and second cavities in the ILD, each over and perpendicular to the Si fin; forming a high-K dielectric layer over the ILD and in each of the first and second cavities; forming a pWF metal layer over the high-K dielectric layer in the first cavity; recessing the pWF metal layer to a first height above the fin; forming an nWF metal layer in the first and second cavities over the high-K dielectric layer and the pWF metal layer; recessing the nWF metal layer to a second height, above an edge of the pWF metal layer; forming a barrier metal layer over the high-K dielectric layer and nWF metal layer; filling the first and second cavities with low-resistive metal fill; removing portions of the low-resistive metal fill by chemical mechanical planarization (CMP); and recessing the barrier metal layer and the high-K dielectric layer, to a third height, above an edge of the nWF metal layer, and concurrently etching the low resistive metal fill.

Another aspect of the present disclosure includes recessing each of the pWF and nWF metal layers by chamfering. Further aspects include chamfering by spin-on hard-mask or optical planarization layer (SOH/OPL) coating, reactive ion etching (RIE) and WFM wet etch removal. Other aspects include forming the high-K dielectric layer to a thickness of 5 angstrom (Å) to 25 Å. Additional aspects include forming the pWF metal layer of titanium nitride (TiN) to a thickness of 5 Å to 50 Å. Further aspects include forming the barrier metal layer to a thickness of 25 Å to 75 Å. Another aspect includes recessing the pWF metal layer to the first height of 2 nm to 25 nm above the Si fin. Other aspects include recessing the nWF metal layer to the second height of 4 nm to 30 nm above the Si fin. Additional aspects include recessing the barrier metal layer and the high-K dielectric layer to the third height of 9 nm to 35 nm above the Si fin. Further aspects include recessing the barrier metal layer and the high-K dielectric layer and etching the low-resistive metal by RIE, the low-resistive metal forming a bump extending to a height of 14 nm to 40 nm above the Si fin. In addition, the WFM heights above can be further optimized for gates with different fin heights and gate critical dimensions (CDs).

A further aspect of the present disclosure is a device including: an ILD over a Si fin; first and second cavities in the ILD, each over and perpendicular to the Si fin; a high-K dielectric layer on side and bottom surfaces of the first and second cavities; a pWF metal layer over the high-K dielectric layer in the first and second cavities; an nWF metal layer over the pWF metal layer and over edges of the pWF metal layer in the first cavity and over the high-K dielectric layer in the second cavity; a barrier metal layer over the nWF metal layer and over edges of the nWF layer; and low resistive metal filling the first and second cavities and forming a bump at a center of each cavity.

Aspects of the device include the high-K dielectric layer having a thickness of 5 Å to 25 Å. A further aspect includes the low-resistive metal bump extending to a height of 14 nm to 40 nm above the Si fin. Another aspect includes the pWF metal layer having a thickness of 5 Å to 50 Å. A further aspect includes the barrier metal layer having a thickness of 25 Å to 75 Å.

Another aspect of the present disclosure is a method including: forming an ILD over a Si fin; forming first and second cavities in the ILD over and perpendicular to the Si fin, the first cavity having a greater width than the second cavity; forming a high-K dielectric layer to a thickness of 5 Å to 25 Å over the ILD and in the first and second cavities; forming a pWF metal layer by atomic layer deposition (ALD) to a thickness of 5 Å to 50 Å in the first and second cavities; recessing the pWF metal layer by chamfering to a first height of 2 nm to 25 nm above the Si fin; forming an nWF metal layer by ALD in the cavities over the exposed high-K dielectric layer and the pWF metal layer; recessing the nWF metal layer by chamfering to a second height of 4 nm to 30 nm above the Si fin, but covering an edge of the pWF metal layer; forming a barrier metal layer by either metal organic chemical vapor deposition (MOCVD), ALD, physical vapor deposition (PVD) to a thickness of 25 Å to 75 Å over the high-K dielectric layer and the nWF metal layer; filling the first and second cavities with low-resistive metal; removing portions of the low-resistive metal fill by CMP; and performing RIE, recessing the barrier metal layer, the high-K dielectric layer, and the low-resistive metal to a third height of 9 nm to 35 nm above the Si fin except for a low-resistive metal bump or a final gate height extending to 14 nm to 40 nm above the Si fin at a center of each cavity.

Aspects of the method include chamfering the pWF and nWF metal layers by a maskless process including SOH/OPL coatings, RIE and WFM wet etch removal. Another aspect include the first cavity forming a long channel device, and the second cavity forming a short channel device, the method further including controlling a height of the final gate height in the first and second cavities in the first and second cavities. Other aspects include forming a width of the long channel device to 2 to 12 times the width of the short channel device. Additional aspect includes chamfering the long channel device and the short channel device simultaneously.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of CD driven metal pinch-off, causing increased gate resistance, process variation in gate heights and susceptibility of residues inside the gates attendant upon conventional work-function metal and tungsten (W) deposition. In accordance with embodiments of the present disclosure, a pWF metal and an nWF metal layer are each recessed by chamfering. Also, the high-K dielectric layer remains as an etch stop during RIE processes, allowing a barrier metal to be thinner, thereby reducing metal pinch-off such that gate resistance is not increased.

Methodology in accordance with embodiments of the present disclosure includes forming an ILD over a Si fin and two cavities in the ILD, each over and perpendicular to the Si fin. Next, a high-K dielectric layer is formed over the ILD and in each of the two cavities. A pWF metal layer is then formed over the high-K dielectric layer in one cavity and recessed to a first height above the fin. Next, an nWF metal layer is formed in both cavities over the high-K dielectric layer and the pWF metal layer. The nWF metal layer is recessed to a second height, above an edge of the pWF metal layer. Thereafter, a barrier metal layer is formed over the high-K dielectric layer and nWF metal layer, and the two cavities are filled with low-resistive metal fill followed by low-resistive metal fill CMP. The barrier metal layer and the high-K dielectric layer are recessed to a third height, above an edge of the nWF metal layer, and concurrently the low-resistive metal fill is etched.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
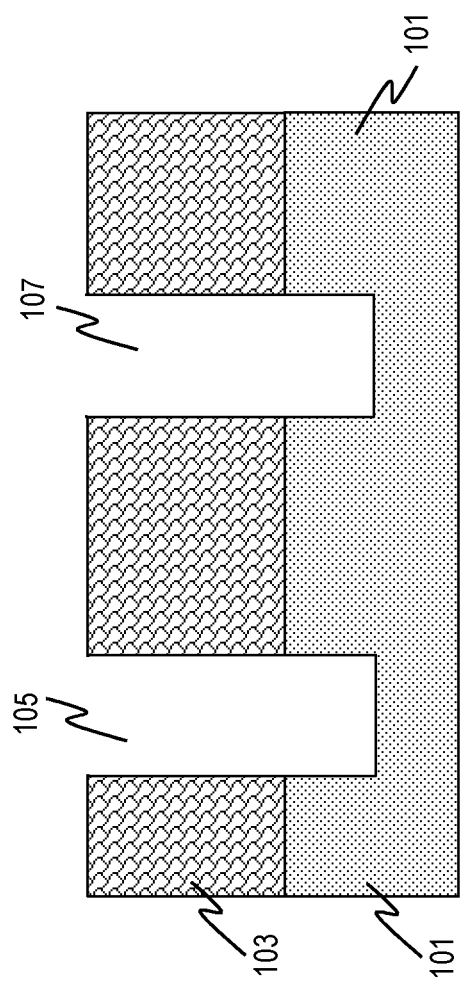
FIGS. 1A to 1F schematically illustrate a process flow for chamfering work-function metals for gate height control in PFET and NFET regions, in accordance with an exemplary embodiment.
Figure 1B:
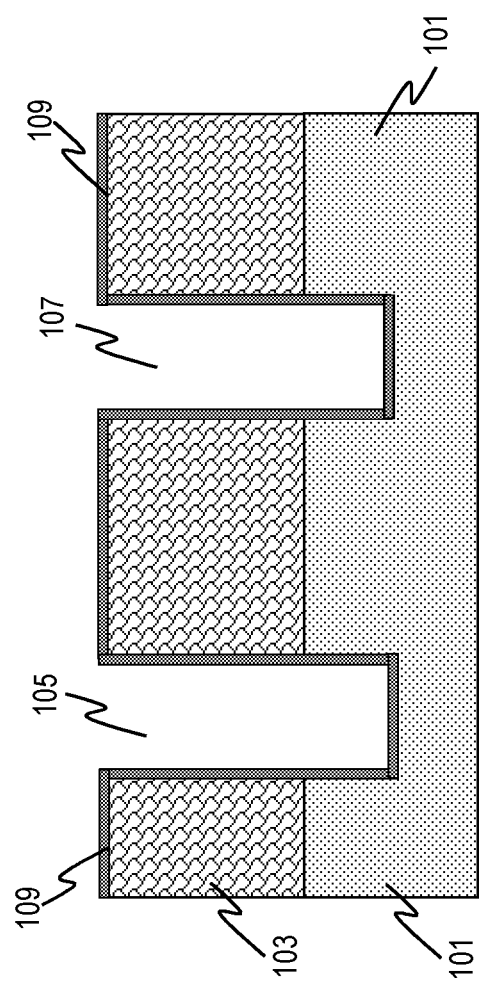

FIG. 1A through 1F schematically illustrate a process flow for chamfering work-function metals for gate height control in PFET and NFET regions, in accordance with an exemplary embodiment. Adverting to FIG. 1A, an ILD 103 is formed to a thickness of 70 nm to 100 nm over a silicon (Si) fin 101. Then, cavities 105 and 107 are formed in the ILD 103, each over and perpendicular to the Si fin 101. A high-K dielectric layer 109 is conformally formed over the ILD 103 and on side and bottom surfaces of the cavities 105 and 107 to a thickness of 5 Å to 25 Å, as illustrated in FIG. 1B. The high-k dielectric layer 109 may be formed, e.g., of hafnium oxide ($HfO_2$), zirconium dioxide ($ZrO_2$), aluminum oxide ($Al_2O_3$), titanium dioxide ($TiO_2$), tantalum pentoxide ($Ta_2O_5$), lanthanide oxides and mixtures thereof, silicates and materials such as yttria-stabilized zirconia (YSZ), barium strontium titanate (BST), barium titanate (BT), strontium titanate (ST), or bismuth strontium tantalunate (SBT). The high-K dielectric layer 109 acts as an etch stop layer during a subsequent RIE process. The cavities 105 and 107, including the high-K dielectric layer 109, have a CD, e.g., of 12 nm to 28 nm.

Figure 1C:
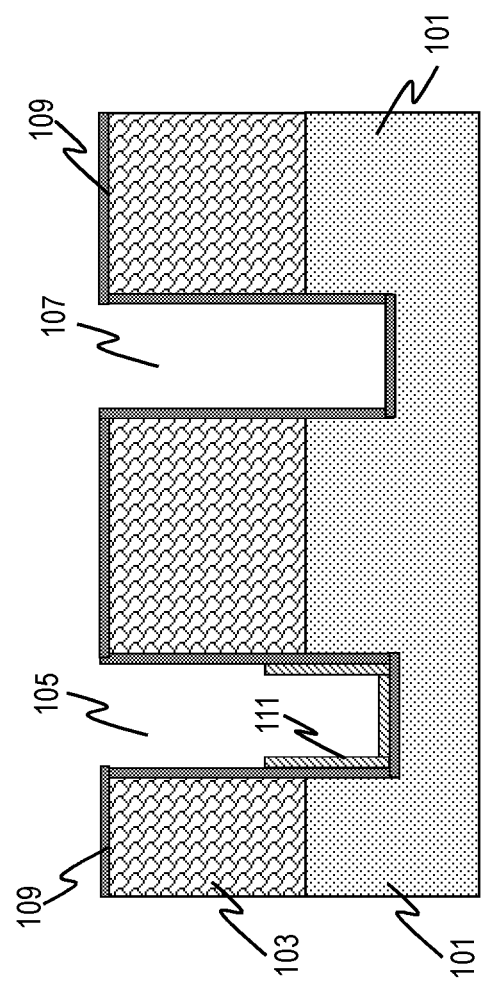

Adverting to FIG. 1C, a pWF metal layer 111 is formed by ALD, e.g., to a thickness of 5 Å to 50 Å over the high-K dielectric layer 109 in the first cavity 105. The pWF metal layer 111 may be formed, e.g., of TiN, tantalum nitride (TaN), tantalum carbides (TaC), tantalum carbonitride (TaCN), niobium nitride (NbN), tantalum borocarbonitride (TaBCN), or tungsten nitride (WN). The pWF metal layer 111 is selectively patterned in certain regions to specific thicknesses by depositing or removing masks to define multiple Vts. Next, the pWF metal layer 111 is recessed by chamfering: a first SOH/OPL layer (not shown for illustrative convenience) is formed over the pWF metal layer 111 in the first cavity 105 and recessed by RIE. Then, a second SOH/OPL layer (not shown for illustrative convenience) is formed over the first SOH/OPL layer in the first cavity 105, and the first and the second SOH/OPL/OPL layers are recessed closer to the top of the fin 101. The first and second SOH/OPL RIE times can be optimized depending on incoming gate height and the desired WF metal height above the fin. Next, the exposed portion of the pWF metal layer 111 above the first and the second SOH/OPL layers is removed by wet etching. Thereafter, the first and the second SOH/OPL layers are removed by ashing and wet etching. As a result, the pWF metal layer 111 is recessed to a height of 2 nm to 25 nm above the Si fin 101.

Figure 1D:
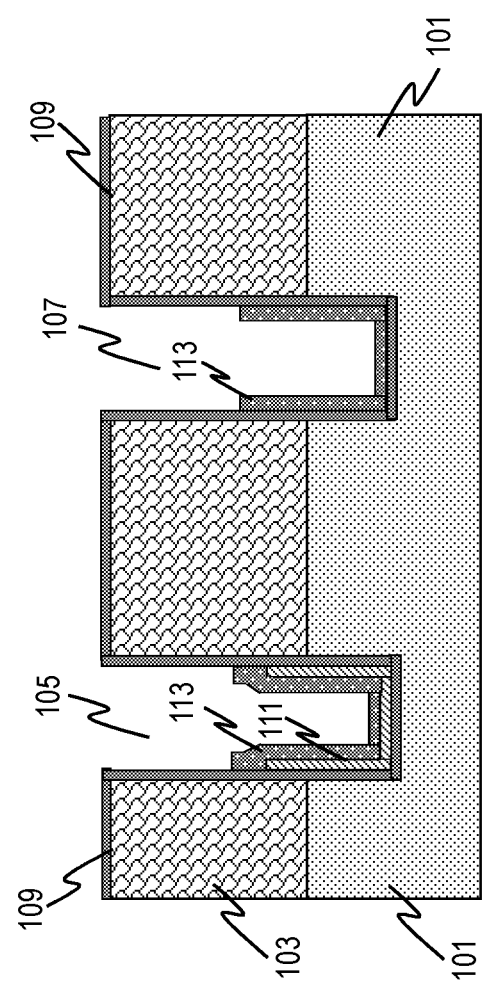

Next, as illustrated in FIG. 1D, an nWF metal layer 113 is formed by ALD over the high-K dielectric layer 109 in the cavities 105 and 107 and the pWF metal layer 111 in the cavity 105. The nWF metal layer 113 may be formed, e.g., of titanium-aluminum carbide (TiCAl), niobium carbide (NbC), TaSiAlC, tungsten carbide (WC), or titanium aluminide (TiAl). The nWF metal layer 113 is recessed by chamfering: a first SOH/OPL layer (not shown for illustrative convenience) is formed over the nWF metal layer 113 and recessed by RIE. Then, a second SOH/OPL layer (not shown for illustrative convenience) is formed over the first SOH/OPL layer, and the first and the second SOH/OPL layers are recessed closer to the top of the fin 101. The first and second SOH/OPL RIE times can be optimized depending on incoming gate height and the desired WF metal height above the fin. Thereafter, the exposed portion of the nWF metal layer 113 above the first and second SOH/OPL layers is removed by wet etching. Then, the first and the second SOH/OPL layers are removed by ashing and wet etching. As a result, the nWF metal layer 113 is recessed to a height of 4 nm to 30 nm, for example, above the fin 101, and above the top edges of the pWF metal layer 111.

Figure 1E:
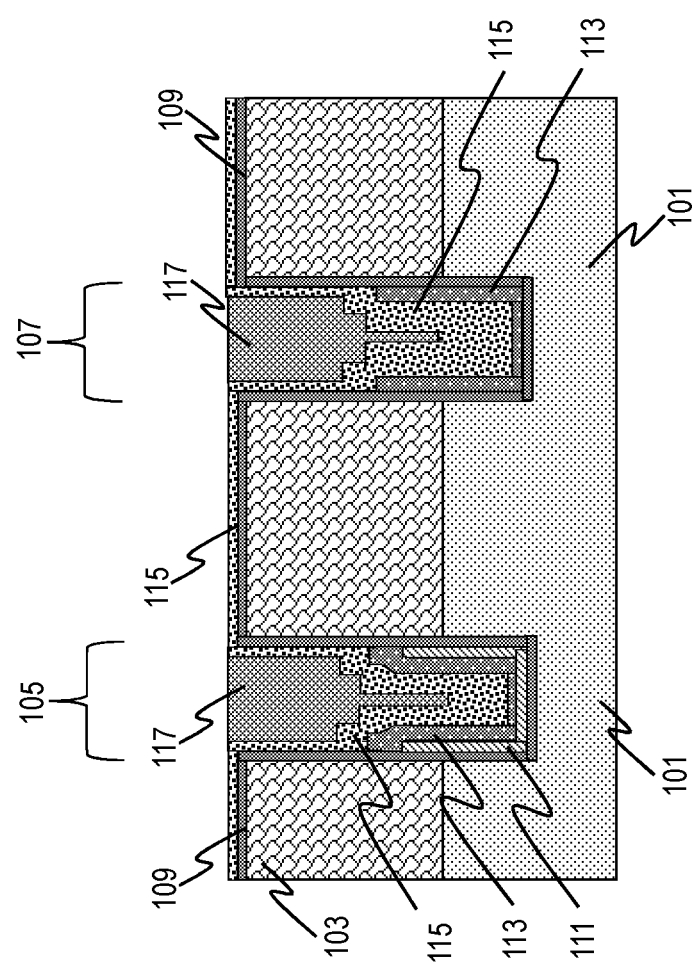
Figure 1F:
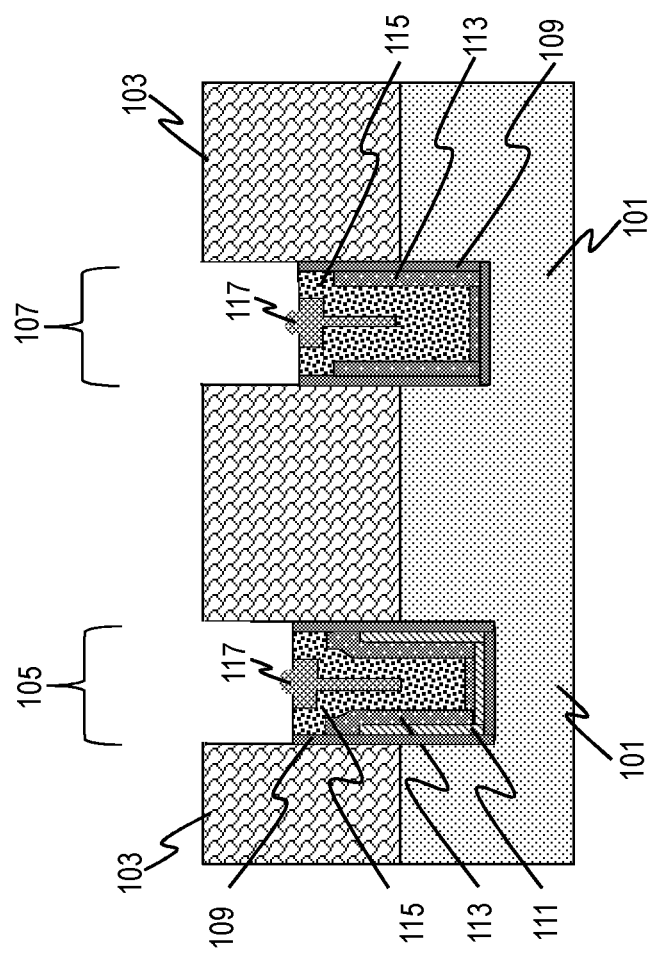

Adverting to FIG. 1E, a barrier metal layer 115 is formed, e.g., by metal organic chemical vapor deposition (MOCVD) to a thickness of 25 Å to 75 Å, over the high-K dielectric layer 109 and nWF metal layer 113. The barrier metal layer 115 may be formed, e.g., of TiN or fluorine free tungsten (FFW). Then, a low-resistive metal fill 117 formed, e.g., of W, cobalt (Co), nickel (Ni), Copper (Cu), aluminum (Al), or polysilicon (poly-Si), is deposited by chemical vapor deposition (CVD) over the barrier metal layer 115, filling the cavities 105 and 107. Thereafter, the barrier metal layer 115 and low-resistive metal fill 117 are planarized (not shown for illustrative convenience), e.g., by W CMP, down to the top of the ILD 103. Next, in FIG. 1F, the barrier metal layer 115 and the high-K dielectric layer 109 are recessed by RIE to a height of 9 nm to 35 nm above the Si fin 101, and portions of the barrier metal layer 115 and the high-K dielectric layer 109 remain, above the top edges of the nWF metal layer 113. Concurrently, the low-resistive metal fill 117 is etched by RIE, forming a bump extending, e.g., to a height of 14 nm to 40 nm, above the Si fin 101 at the center of each of cavity 105 and 107. The recess of the low-resistive metal fill 117 by RIE is self-limiting at the nWF, thereby enabling recess control. In addition, the bump of low-resistive metal fill 117 at the center of the cavities 105 and 107 protects the underlying work-function metal seam.

Figure 2A:
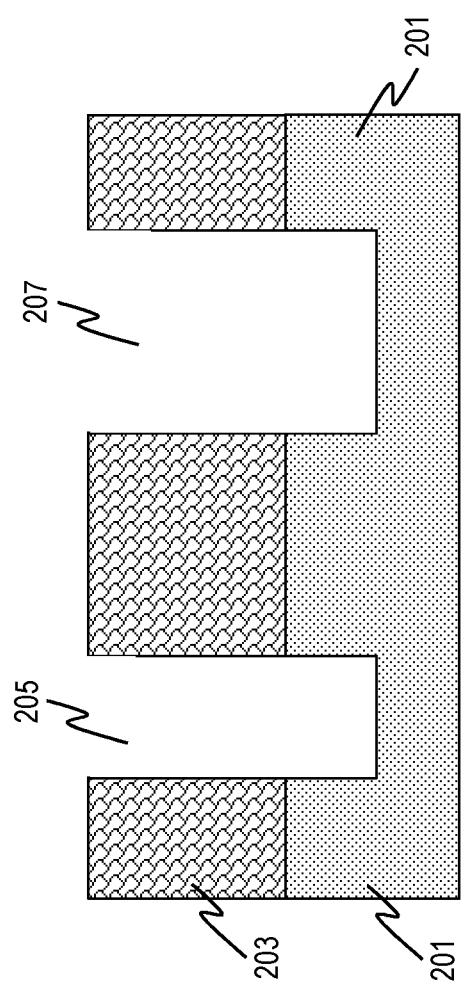
FIGS. 2A to 2F schematically illustrate a process flow for chamfering work-function metals for gate height control in short channel and long channel regions, in accordance with an exemplary embodiment.
Figure 2B:
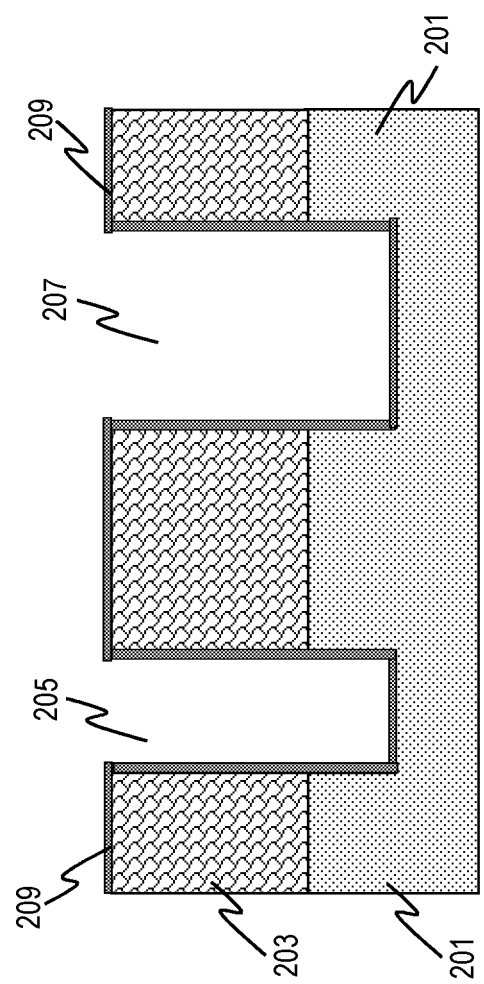

FIG. 2A through 2F schematically illustrate a process flow for chamfering work-function metals for gate height control in short channel and long channel devices, in accordance with an exemplary embodiment. Adverting to FIG. 2A, an ILD 203 is formed, e.g., to a thickness of 70 nm to 100 nm, over a Si fin 201. Then, cavities 205 and 207 are formed in the ILD 203, each over and perpendicular to the Si fin 201. Cavity 207 has a width greater than cavity 205 e.g., 2 to 12 times the width of cavity 205. A high-K dielectric layer 209 is conformally formed over the ILD 203 and on side and bottom surfaces of the cavities 205 and 207, e.g., to a thickness of 5 Å to 25 Å, as illustrated in FIG. 2B. The high-K dielectric layer 209 acts as an etch stop layer during a subsequent RIE process.

Figure 2C:
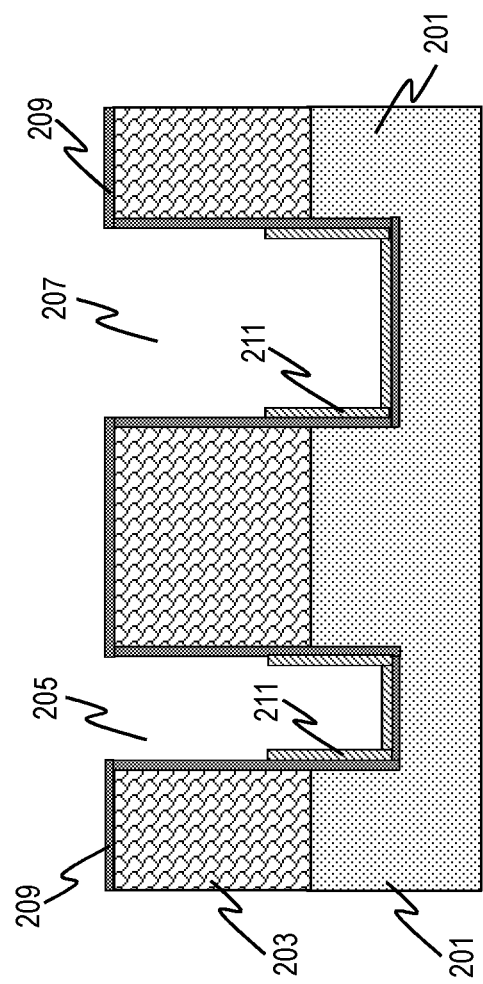

Adverting to FIG. 2C, a pWF metal layer 211 is formed by ALD, e.g., to a thickness of 5 Å to 50 Å, over the high-K dielectric layer 209 in the cavities 205 and 207. The pWF metal layer 211 may be formed, e.g., of TiN, TaN, TaC, TaCN, NbN, TaBCN, or WN. The pWF metal layer 211 is recessed by chamfering: a first coating layer (not shown for illustrative convenience), e.g., formed of SOH, OPL, or the like is formed over the pWF metal layer 211 in the cavities 205 and 207 and recessed by RIE. Then, a second coating layer (not shown for illustrative convenience), e.g., formed of SOH,OPL, or the like, is formed over the first coating layer in the cavities 205 and 207, and the first and the second coating layers are recessed closer to the top of the fin 201. The first and second coating layers RIE times can be optimized depending on incoming gate height and the desired WF metal height above the fin. Next, the exposed portion of the pWF metal layer 211 above the first and the second coating layers is removed by wet etching. Thereafter, the first and the second coating layers are removed by ashing and wet etching. As a result, the pWF metal layer 211 is recessed to a height of 2 nm to 25 nm, for example, above the Si fin 201.

Figure 2D:
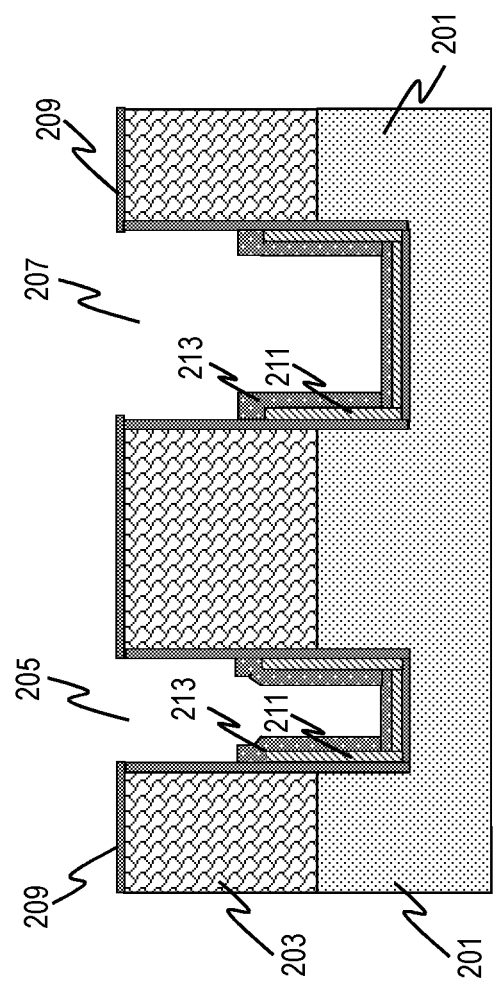

Next, as illustrated in FIG. 2D, an nWF metal layer 213 is formed, e.g., of TiCAl, NbC, TaSiAlC, WC, or TiAl, by ALD over the exposed high-K dielectric layer 209 and the pWF metal layer 211 in the cavities 205 and 207. The nWF metal layer 213 is then recessed by chamfering: a first coating layer not shown for illustrative convenience), e.g., formed of SOH, OPL, or the like, is formed over the nWF metal layer 213 and recessed by RIE. Then, a second coating layer (not shown for illustrative convenience) e.g., formed of SOH, OPL, or the like, is formed over the first coating layer, and the first and the second coating layers are recessed closer to the top of the fin 201. The first and second coating layers RIE times can be optimized depending on incoming gate height and the desired WF metal height above the fin 201. Thereafter, the exposed portion of the nWF metal layer 213 above the first and the second coating layers is removed by wet etching. Then, the first and the second coating layers are removed by ashing and wet etching. As a result, the nWF metal layer 213 is recessed to a height of, e.g., 4 nm to 30 nm above the Si fin, but still covers the top edges of the pWF metal layer 211.

Figure 2E:
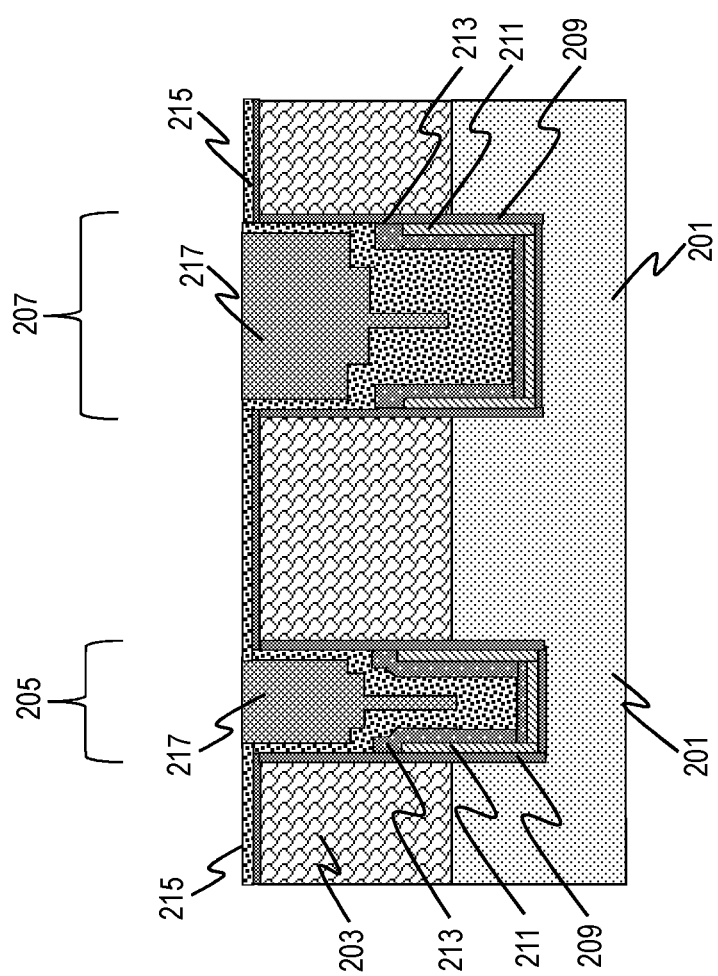
Figure 2F:
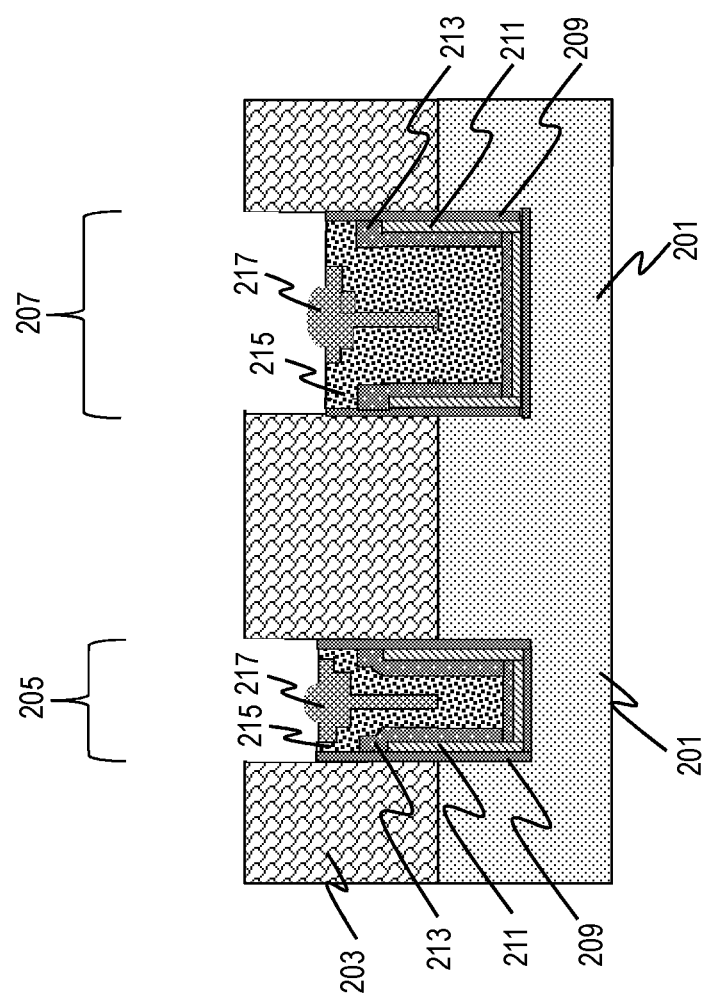

Adverting to FIG. 2E, a barrier metal layer 215 is formed, e.g., of TiN or FFW, by MOCVD to a thickness of 25 Å to 75 Å over the high-K dielectric layer 209 and the nWF metal layer 213. Then, a low-resistive metal layer 217, e.g., formed of W, Co, Ni, Cu, Al, or poly-Si, is deposited by CVD over the barrier metal layer 215, filling the cavities 205 and 207. The barrier metal layer 215 and the low-resistive metal layer 217 are planarized (not shown for illustrative convenience) e.g., by W CMP, down to the ILD 203. Next, in FIG. 2F, the barrier metal layer 215, and the high-K dielectric layer 209 are recessed by RIE to a height of 9 nm to 35 nm above the Si fin 201, and portions of the barrier metal layer 215 and the high-K dielectric layer 209 remain above the top edges of the nWF metal layer 213. Concurrently, the low-resistive metal layer 217 is etched by RIE, forming a bump extending to a height of 14 nm to 40 nm above the Si fin 201 at the center of each of the cavity 205 and 207.

The embodiments of the present disclosure can achieve several technical effects, such as metal height control and SAC cap budget control in NFET versus PFET regions, better recess control since the low-resistive metal recess RIE is self-limiting at the nWF metal; a thinner barrier metal can be used, allowing for more W inside the gate, which in turn decreases gate resistance; and the process is maskless. In addition, the present disclosure can achieve uniform gate recesses and gate height control across short and long channel lengths or gate widths. Further, when the low-resistive metal fill recess is performed all of the gates, NFETS, PFETs, and PB structures only have the barrier metal and low-resistive metal fill on the interior sidewalls, makes the low-resistive metal recess RIE simpler and uniform. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated finFET semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   an interlayer dielectric (ILD) over a silicon (Si) fin;
   first and second cavities in the ILD, each over and perpendicular to the Si fin;
   a high-K dielectric layer on side and bottom surfaces of the first and second cavities;
   a p-type work function (pWF) metal layer over the high-K dielectric layer in the first and second cavities;
   an n-type work function (nWF) metal layer over the pWF metal layer in the first cavity and the second cavity;
   a barrier metal layer over the nWF metal layer and over edges of the nWF layer,
   wherein the first and second cavities comprise a low-resistive metal filling with a bump at a center of each cavity, and
   wherein the low-resistive metal bump extends to a height of 14 nm to 40 nm above the Si fin.

2. The device according to claim 1, wherein the high-K dielectric layer has a thickness of 5 angstrom (Å) to 25 Å.

3. The device according to claim 1, wherein the pWF metal layer has a thickness of 5 Å to 50 Å.

4. The device according to claim 1, wherein the barrier metal layer has a thickness of 25 Å to 75 Å.

5. The device according to claim 1, wherein the first low-resistive metal filled cavity forms a long channel device.

6. The device according to claim 5, wherein the second low-resistive metal filled forms a short channel device.

7. The device according to claim 6, wherein a width of the long channel device is 2 to 12 times a width of the short channel device.

8. A device comprising:
   a dielectric layer over a silicon (Si) fin;
   first and second cavities in the dielectric, each over and perpendicular to the Si fin;
   a high-K dielectric layer on side and bottom surfaces of the first and second cavities;
   a p-type work function (pWF) layer over the high-K dielectric layer in the first and second cavities;
   an n-type work function (nWF) layer over the pWF layer in the first cavity and the second cavity; and
   a barrier layer over the nWF layer and over edges of the nWF layer,
   wherein the first and second cavities comprise a metal filling with a bump at a center of each cavity, and
   wherein the bump comprises a low-resistive metal and extends to a height of 14 nm to 40 nm above the Si fin.

9. The device according to claim 8, wherein the high-K dielectric layer has a thickness of 5 angstrom (Å) to 25 Å.

10. The device according to claim 8, wherein the pWF layer comprises a metal having a thickness of 5 Å to 50 Å.

11. The device according to claim 8, wherein the barrier layer comprises a metal having a thickness of 25 Å to 75 Å.

* * * * *